(12) United States Patent
Su et al.

(10) Patent No.: US 10,159,157 B2
(45) Date of Patent: Dec. 18, 2018

(54) COMPLIANT PCB-TO-HOUSING FASTENER (71) Applicant: Continental Automotive Systems, Inc., Auburn Hills, MI (US)

(72) Inventors: Patrick C Su, Shelby Township, MI (US); Kevin Douglas Moore, Bloomfield Hills, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/231,176

(22) Filed: Aug. 8, 2016

(65) Prior Publication Data
US 2018/0042128 A1   Feb. 8, 2018

(51) Int. Cl.
*G06F 1/16* (2006.01)
*H05K 5/00* (2006.01)
(Continued)

(52) U.S. Cl.
CPC ........... *H05K 5/0217* (2013.01); *H05K 5/006* (2013.01); *H05K 5/0047* (2013.01); *H05K 7/142* (2013.01);
(Continued)

(58) Field of Classification Search
CPC . G06F 1/1601–1/1611; G06F 1/1613–1/1698; G06F 1/18–1/189; H05K 5/00–5/069; H05K 7/00–7/186
USPC .... 361/679.01–679.45, 679.55–679.61, 756, 361/741, 686, 687, 787, 789, 794, 361/807–810, 676–678, 679.46–679.54,
(Continued)

(56) References Cited

U.S. PATENT DOCUMENTS

| 4,526,429 A | 7/1985 | Kirkman |
| 4,530,551 A | 7/1985 | Benasutti |

(Continued)

FOREIGN PATENT DOCUMENTS

| CA | 1209220 A | 7/1984 |
| CA | 2805426 A1 | 1/2012 |

(Continued)

OTHER PUBLICATIONS

Great Britain Search Report dated Feb. 9, 2017 for corresponding GB application No. GB1614528.6.
(Continued)

*Primary Examiner* — Anthony Haughton
*Assistant Examiner* — Razmeen Gafur (57) ABSTRACT

A fastener is provided for fastening a printed circuit and an electronics housing. The fastener has a lead-in feature extending from the fastener and at least one pin extending the fastener. An intermediate standoff portion may be disposed between the lead-in feature and the pin. An electronics housing may be provided that includes the fastener, an electronics housing structure, and a printed circuit board (PCB) disposed adjacent to the electronics housing structure. The lead-in feature may be press fit into an aperture in the housing structure aperture, and the pin may be press fit into an aperture in the PCB. A method of forming an engine control unit is also provided. The method includes providing a PCB, press fitting a fastener to the PCB, dispensing thermal interface material onto a housing structure, pressing the PCB onto the thermal interface material, and press fitting the fastener into the housing structure.

14 Claims, 11 Drawing Sheets

(51) Int. Cl.
  *H05K 5/02* (2006.01)
  *H05K 7/20* (2006.01)
  *H05K 7/14* (2006.01)
  *H05K 9/00* (2006.01)
  *H05K 7/00* (2006.01)
(52) U.S. Cl.
  CPC ....... *H05K 7/20445* (2013.01); *H05K 9/0039* (2013.01)
(58) Field of Classification Search
  USPC ......... 361/688–723, 724–727; 348/787, 789, 348/794; 349/56–60; 455/575.1–575.9; 335/214, 219, 225, 228–230, 234, 250, 335/262, 274, 275, 285, 296, 302–306; 312/223.1–223.3
  See application file for complete search history.

(56) References Cited

U.S. PATENT DOCUMENTS

| | | | |
|---|---|---|---|
| 4,718,854 A | 1/1988 | Capp et al. | |
| 4,720,268 A | 1/1988 | Weiss | |
| 4,816,896 A | 3/1989 | Owens | |
| 5,073,119 A | 12/1991 | Soes | |
| 5,120,258 A | 6/1992 | Carlton | |
| 5,411,418 A | 5/1995 | Welsh et al. | |
| 5,424,918 A | 6/1995 | Felps et al. | |
| 5,603,103 A | 2/1997 | Halttunen et al. | |
| 5,609,491 A | 3/1997 | Cooper et al. | |
| 5,761,050 A | 6/1998 | Archer | |
| 5,861,783 A | 1/1999 | Savicki | |
| 5,980,271 A | 11/1999 | MacDougall et al. | |
| 6,075,700 A | 6/2000 | Houghton et al. | |
| 6,212,071 B1* | 4/2001 | Roessler | H05K 1/0209 174/252 |
| 6,312,296 B1 | 11/2001 | Jones | |
| 6,443,768 B1 | 9/2002 | Dirkers et al. | |
| 6,447,326 B1 | 9/2002 | Teach et al. | |
| 6,670,559 B2 | 12/2003 | Centola et al. | |
| 6,719,573 B2 | 4/2004 | Koehler et al. | |
| 7,072,179 B1* | 7/2006 | Curran | G06F 1/16 165/104.32 |
| 7,170,166 B2 | 1/2007 | Rofougaran | |
| 7,220,135 B1 | 5/2007 | Brekosky et al. | |
| 7,445,457 B1 | 11/2008 | Frangioso, Jr. et al. | |
| 7,479,017 B1 | 1/2009 | Koopman et al. | |
| 7,548,418 B2 | 6/2009 | Martin et al. | |
| 8,292,639 B2 | 10/2012 | Achammer et al. | |
| 8,627,564 B2 | 1/2014 | Blossfield et al. | |
| 8,684,980 B2 | 4/2014 | Hunter et al. | |
| 2001/0046817 A1 | 11/2001 | Putnam | |
| 2002/0030972 A1* | 3/2002 | Ali | H01L 23/4006 361/704 |
| 2002/0054480 A1* | 5/2002 | Jitaru | H01F 27/06 361/704 |
| 2003/0107874 A1* | 6/2003 | Feigenbaum | H05K 7/1023 361/704 |
| 2005/0018386 A1* | 1/2005 | Beihoff | B60L 11/12 361/676 |
| 2005/0093559 A1 | 5/2005 | Mori et al. | |
| 2005/0135065 A1* | 6/2005 | Nakatsu | H01L 23/4006 361/703 |
| 2005/0135073 A1 | 6/2005 | Thorum | |
| 2007/0236888 A1* | 10/2007 | Eckberg | H01L 23/4006 361/704 |
| 2008/0101033 A1* | 5/2008 | Cromwell | G06F 1/20 361/719 |
| 2008/0144290 A1* | 6/2008 | Brandt | B60R 16/0239 361/720 |
| 2008/0158830 A1 | 7/2008 | Tominaga et al. | |
| 2008/0239677 A1* | 10/2008 | Coleman | H01L 23/4093 361/719 |
| 2009/0168360 A1* | 7/2009 | Negrut | H01L 23/4006 361/710 |
| 2010/0079958 A1* | 4/2010 | Kaehs | H01L 23/4006 361/717 |
| 2010/0091464 A1* | 4/2010 | Ohnishi | H01L 23/053 361/723 |
| 2010/0208425 A1* | 8/2010 | Rapisarda | A41D 27/085 361/692 |
| 2011/0205710 A1* | 8/2011 | Kondo | H05K 7/20436 361/714 |
| 2012/0140421 A1* | 6/2012 | Kirstine | H05K 7/20509 361/722 |
| 2012/0281364 A1* | 11/2012 | Gunderson | H05K 5/0256 361/714 |
| 2013/0050954 A1* | 2/2013 | Albrecht, III | H05K 1/0203 361/720 |
| 2013/0215573 A1* | 8/2013 | Wagner | H05K 7/20927 361/702 |
| 2013/0215576 A1* | 8/2013 | Wennberg | H05K 7/2039 361/715 |
| 2013/0242484 A1 | 9/2013 | Schweichart | |
| 2013/0294032 A1* | 11/2013 | Stella | H01L 23/367 361/718 |
| 2014/0187969 A1 | 7/2014 | Hunter et al. | |
| 2014/0199862 A1 | 7/2014 | Hirschy | |
| 2014/0204533 A1* | 7/2014 | Abeyasekera | H01L 23/3735 361/699 |
| 2014/0204536 A1* | 7/2014 | Jones | H05K 7/02 361/709 |
| 2014/0223203 A1 | 8/2014 | Derouen et al. | |
| 2014/0247554 A1* | 9/2014 | Sharma | H05K 7/1432 361/695 |

FOREIGN PATENT DOCUMENTS

| | | |
|---|---|---|
| CN | 103118642 A | 5/2013 |
| DE | 102006032436 A1 | 1/2008 |
| DE | 102006032441 A1 | 1/2008 |
| DE | 102007021073 A1 | 11/2008 |
| EP | 0132664 A2 | 2/1985 |
| EP | 0392549 A1 | 3/1995 |
| EP | 1017261 A2 | 7/2000 |
| EP | 1256146 | 11/2002 |
| EP | 1425620 | 8/2007 |
| EP | 1425620 A1 | 8/2007 |
| EP | 2593056 | 5/2013 |
| EP | 2840667 A2 | 2/2015 |
| GB | 1316217 A | 5/1973 |
| WO | 01/59885 A2 | 8/2001 |
| WO | 2003/025653 A1 | 3/2003 |
| WO | 2009/034096 A1 | 3/2009 |
| WO | 2009/085975 A2 | 7/2009 |
| WO | 2012/009706 A1 | 1/2012 |
| WO | 2013/148001 A1 | 10/2013 |
| WO | 2014192593 A1 | 12/2014 |
| WO | 2015049770 A1 | 4/2015 |

OTHER PUBLICATIONS

Patent Cooperation Treaty International Search Report dated Nov. 21, 2017 for corresponding PCT application No. PCT/US2017/045826.

Written Opinion of the International Searching Authority dated Nov. 21, 2017 for corresponding PCT application No. PCT/US2017/045826.

\* cited by examiner

COMPLIANT PCB-TO-HOUSING FASTENER

FIELD

The present disclosure relates generally to fasteners for electronics enclosures, and more specifically to a fastener for an electronics enclosure for use in an automotive powertrain system.

BACKGROUND

Modern vehicles, such as cars, incorporate electronic systems and controllers into the engine designs. The electronic systems enable proper operation of the engine and other vehicle systems during all operating conditions. Some operating conditions, such as rain or sleet, are hazardous to exposed electronics and can damage or destroy exposed electronics. In order to protect the electronic systems, typical vehicles isolate the electronic components from the environmental hazards by placing the electronics within an electronics housing module.

Electronics housing modules, or enclosures (for example, ECU enclosures), include a housing body and a cover that seals the housing body. A printed circuit board may be enclosed within the electronics housing module. The printed circuit board may be attached within the electronics housing module by screws, for example. The housing body can further include sealed communication ports allowing the electronics module to be connected to sensors or other electric systems within the vehicle.

The printed circuit board may be attached within the housing body (e.g., ECU enclosure) with a plurality of screws. This requires a number of parts to be assembled in the ECU assembly process.

SUMMARY

Disclosed is a fastener that may be press fit to a housing structure and to a PCB.

In one example, which may be combined with or separate from the other examples provided herein, an electronics housing is provided that includes an electronics housing structure defining a structure aperture therein. A printed circuit board is disposed adjacent to the electronics housing structure. The printed circuit board defines a board aperture therethrough. A fastener has a lead-in feature extending from the fastener and at least one pin extending from the fastener. The lead-in feature is press fit into the structure aperture and the pin is press fit into the board aperture.

In another example, which may be combined with or separate from the other examples described herein, a fastener for a printed circuit and electronics housing is provided. The fastener includes an intermediate standoff portion, a lead-in feature, and at least one pin. The lead-in feature extends from the intermediate standoff portion for attaching the fastener to a housing structure. The pin or pins extend from the intermediate standoff portion for contacting a printed circuit board. The intermediate standoff portion is disposed between the pin or pins and the lead-in feature.

In yet another example, which may be combined with or separate from the other examples described herein, a method of forming an engine control unit is provided. The method includes providing a printed circuit board populated with electrical components, press fitting a fastener to the printed circuit board, dispensing thermal interface material onto a housing structure, pressing the printed circuit board onto the thermal interface material, and press fitting the fastener into the housing structure.

Some variations may also include one or more of the following characteristics, alone or in combination: the lead-in feature extending from a first side of the fastener; the pin extending from a second side of the fastener; the first side being opposite the second side; the at least one pin being a plurality of pins; the fastener further comprising a push feature extending from the second side of the fastener; the push feature being disposed between a first pin and a second pin of the plurality of pins; the push feature configured to allow the lead-in feature to be pushed into the structure aperture; the lead-in feature comprising a plurality of retaining features configured to hold the fastener to a housing structure; the fastener comprising an intermediate standoff portion; the intermediate standoff portion being flat; the lead-in portion of the fastener being flat; the lead-in portion and/or the intermediate standoff portion having a thickness in the range of about 0.5 to 2 millimeters; the fastener being formed of metal; the intermediate standoff portion being disposed between the printed circuit board and the electronics housing structure to create a gap between the printed circuit board and the electronics housing structure; the printed circuit board defining a push feature opening through which the push feature extends; the lead-in feature comprising a plurality of retaining features configured to hold the fastener to the housing structure; the housing enclosure further comprising thermal interface material disposed between the printed circuit board and the electronics housing structure; the method further comprising dispensing sealant material onto the perimeter of the housing structure and crimping a lid onto the housing structure; the step of press fitting the fastener into the housing structure including pressing on a push feature extending from the fastener.

These and other features can be best understood from the following specification and drawings, the following of which is a brief description.

BRIEF DESCRIPTION OF THE DRAWINGS

The drawings are provided for illustrative purposes only and are not intended to limit the invention, as defined in the claims.

DESCRIPTION

Figure 1A:
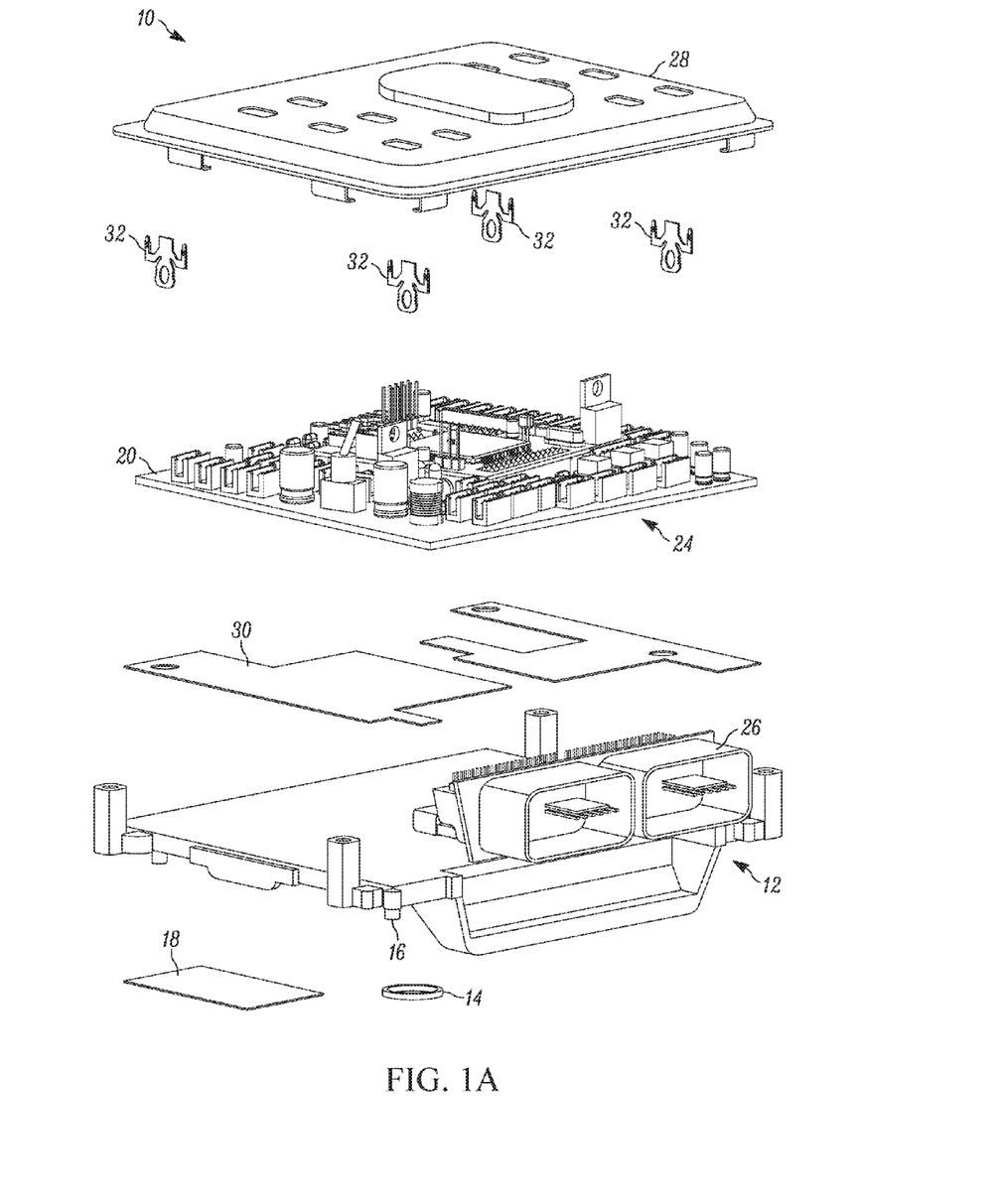
FIG. 1A is an exploded view of an electronics housing having a plurality of fasteners and thermal interface material, in accordance with the principles of the present disclosure.
Figure 1B:
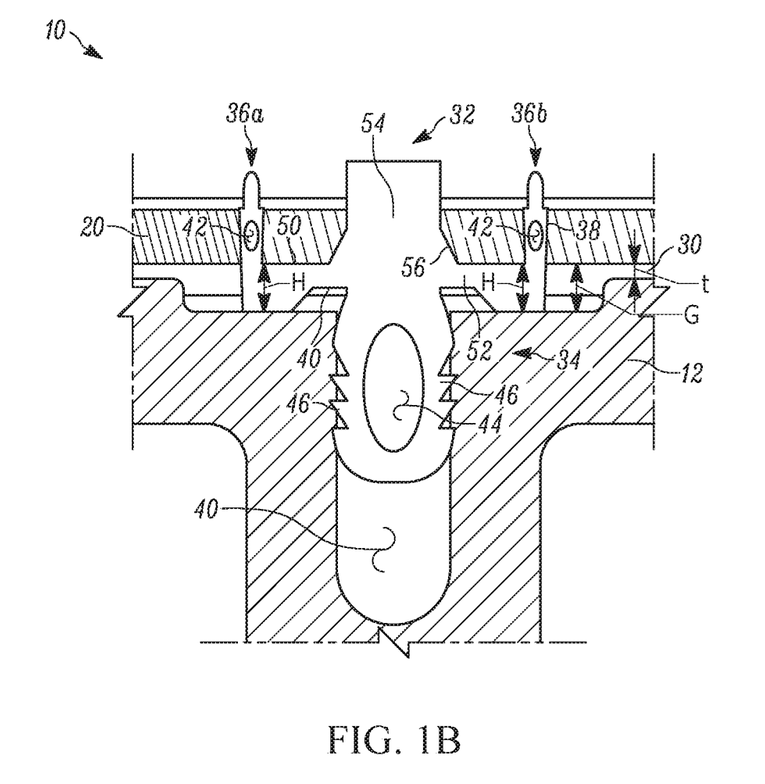
FIG. 1B is a cross-sectional view of a portion of the assembled electronics housing of FIG. 1A, according to the principles of the present disclosure.
Figure 1C:
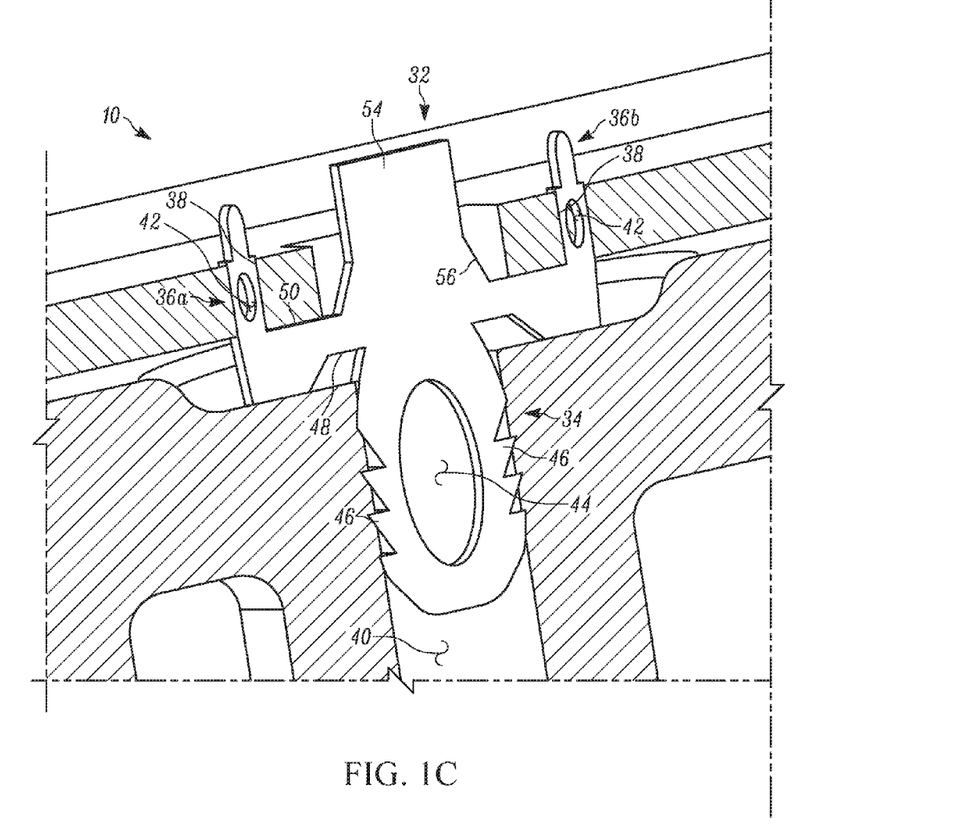
FIG. 1C is a perspective cross-sectional view of a portion of the electronics housing of FIGS. 1A-1B, with the thermal interface material removed for clarity, in accordance with the principles of the present disclosure.
Figure 2A:
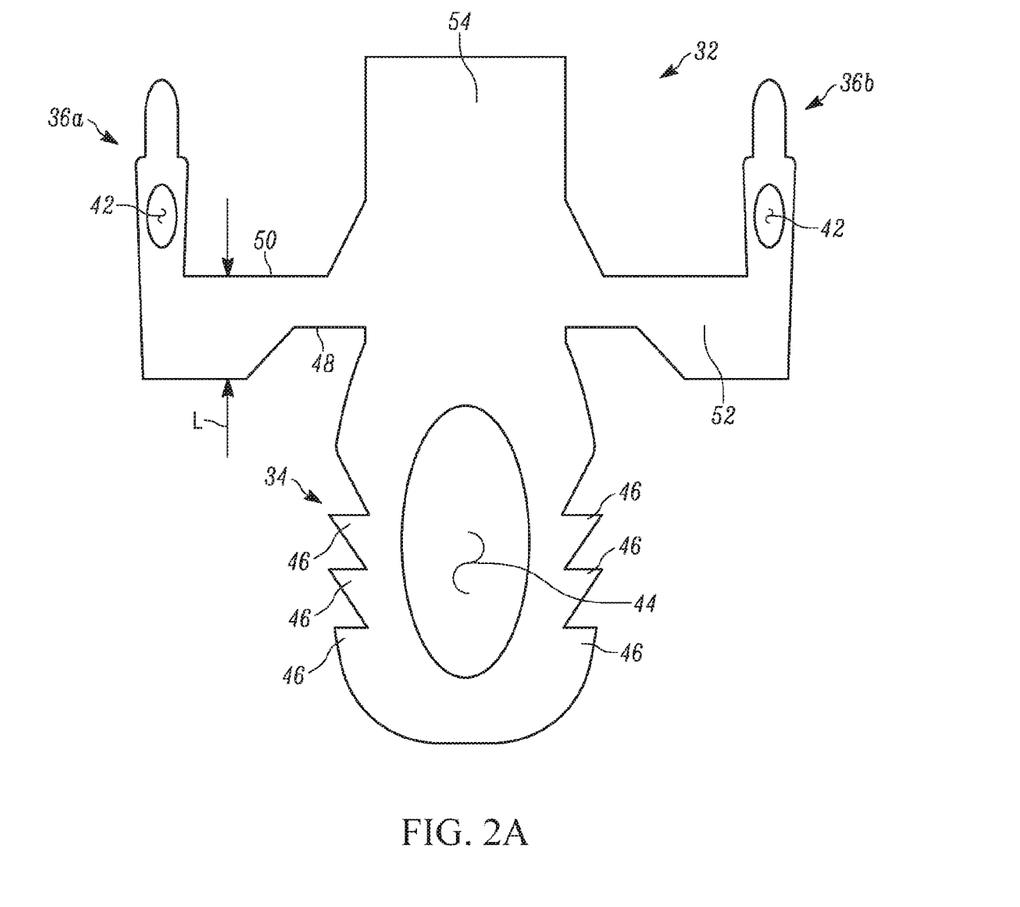
FIG. 2A is a side view of the fastener shown in FIGS. 1A-1C, according to the principles of the present disclosure.
Figure 2B:
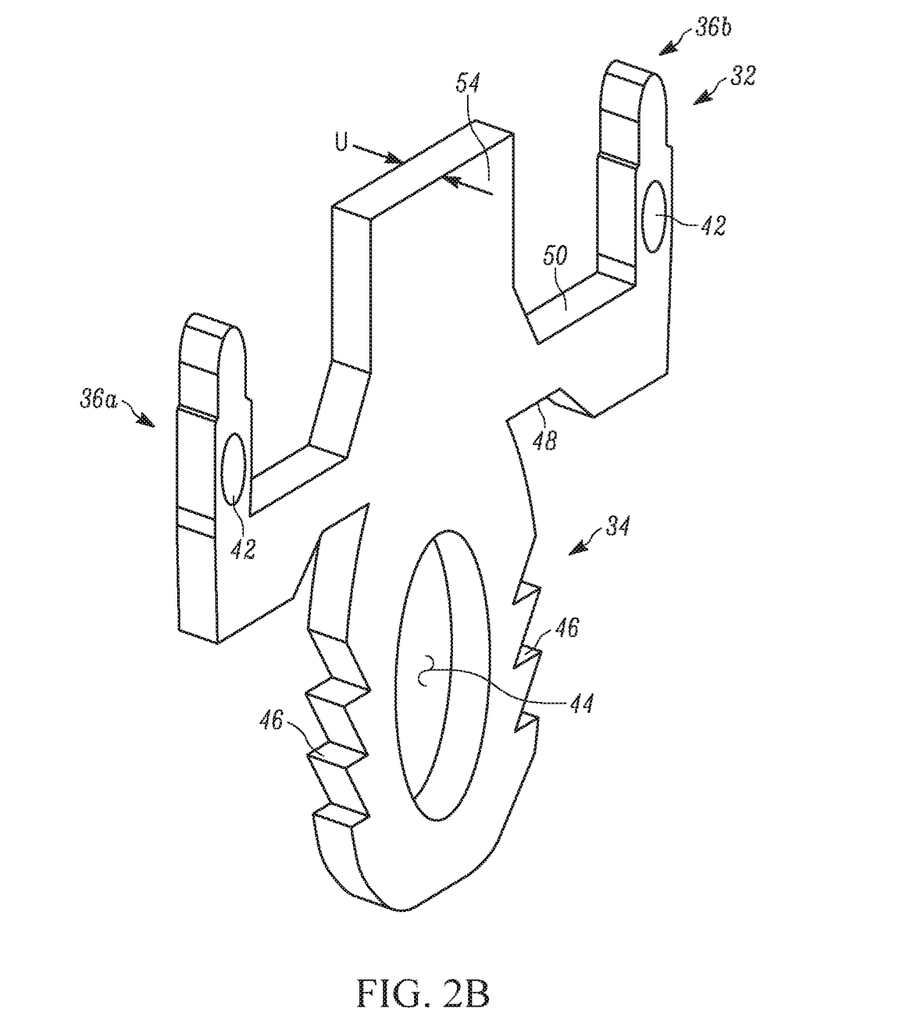
FIG. 2B is a perspective view of the fastener shown in FIGS. 1A-1C and 2A, according to the principles of the present disclosure.
Figure 2C:
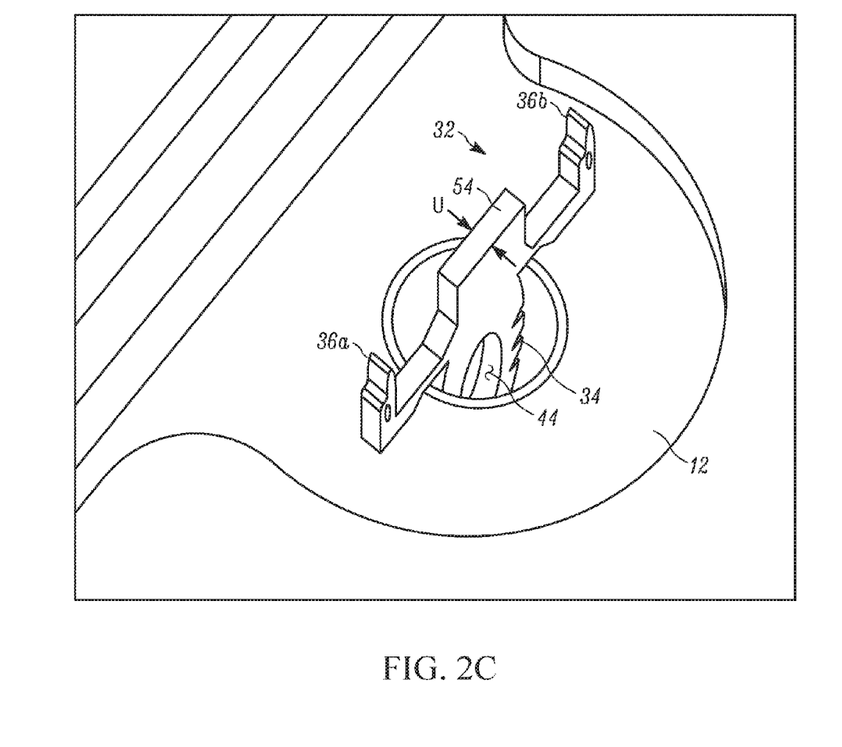
FIG. 2C is a perspective of the fastener shown in FIGS. 1A-1C and 2A-2B, and a portion of the electronics housing shown in FIGS. 1A-1C, in accordance with the principles of the present disclosure.
Figure 3:
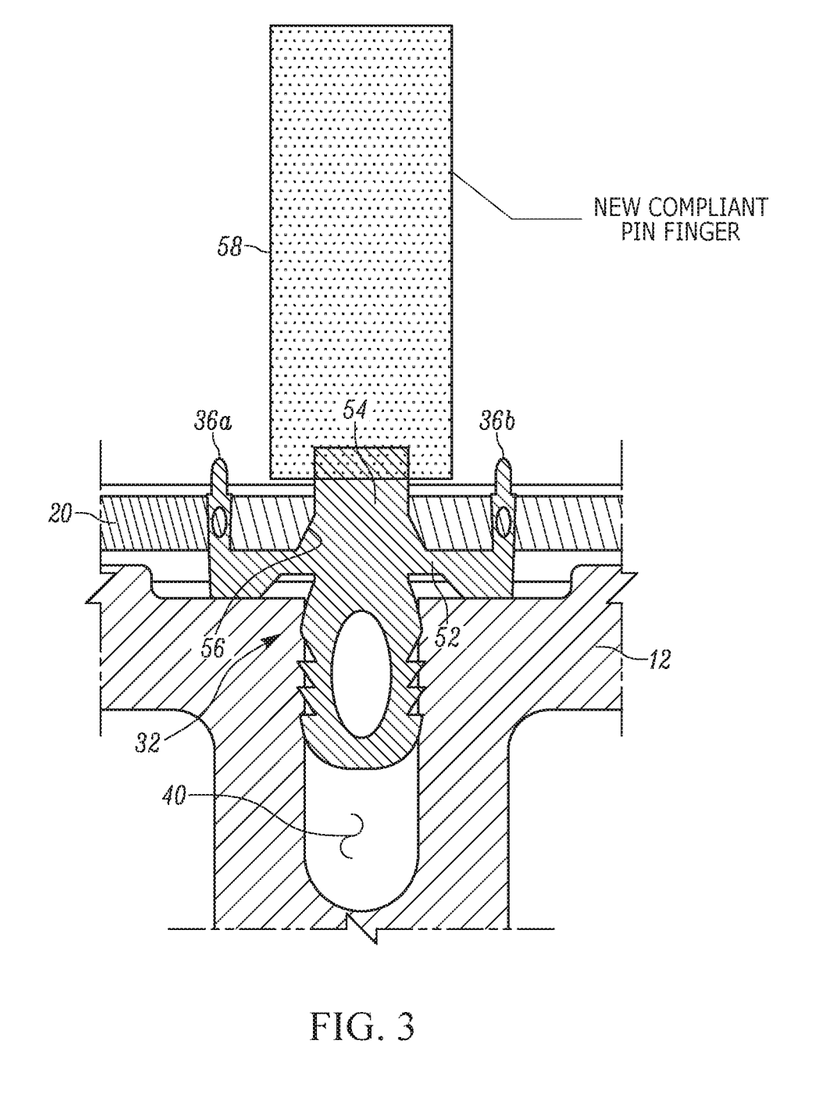
FIG. 3 is a cross-sectional view of a portion of the assembled electronics housing of FIGS. 1A-1C, along a tool for assembling the electronics housing, according to the principles of the present disclosure.

FIG. 1A illustrates a perspective, exploded view of an electronics housing, which is generally designated at 10, as one example of the claimed invention. It should be understood, however, that the invention is not limited to this example. The electronics housing 10 has a housing structure 12, which may be a main body portion or housing. The housing structure 12 may form a base or outer housing for a controller, such as an engine control unit (ECU). The housing structure 12 may be formed, for example, by casting aluminum or steel. The housing structure 12 could alternatively be formed in any other suitable way, such as by stamping aluminum or steel. A small cover 14 may cover a vent hole 16 defined by the housing structure 12, and a label 18 may be affixed to the housing structure 12.

A printed circuit board (PCB) 20 may be disposed in or on, or adjacent to, the housing structure 12 and attached thereto, as described in more detail below. Electrical components 24 may populate the PCB 20, and a connector 26 may be used to electrically and communicatively connect the PCB 20 to components outside of the housing enclosure 10. A cover 28, which may be a stamped steel cover, by way of example, may be attached to the housing structure 12 to enclose the PCB 20 within the housing enclosure 10.

A thermal interface material (TIM) 30 may be disposed between the PCB 20 and the housing structure 12. The thermal interface material (TIM) 30 may be formed of any suitable material, such as a Silicone-based or rubber-based material. For example, a suitable thermal interface material (TIM) 30 may be a Silicone-rubber material sold under the trade name Semicosil. Another suitable thermal interface material may be a thermal gap-filler material, such as an elastomer. A suitable gap-filler material may be an elastomeric material sold by the Berquist company under the product name GF1500. The TIM 30 may assist with heat transfer of the PCB 20 and to avoid a short through the housing structure 12 and elements on the PCB 20.

A plurality of fasteners 32, such as four or more fasteners 32 as shown in FIG. 1A, by way of example, may be implemented to assemble the PCB 20 to the housing structure 12. Referring to FIGS. 1A, 1B, 1C, 2A, 2B, and 2C, the fasteners 32 are shown and described in greater detail. Each fastener 32 has a lead-in feature 34 extending from the fastener 32, and at least one pin 36a, 36b extending from the fastener 32.

In the illustrated example, the PCB 20 defines a plurality of board apertures 38 through which each of the pins 36a, 36b extend to attach each fastener 32 to the PCB 20. The pins 36a, 36b may be press fit into the board apertures 38, by way of example. In the alternative, the pins 36a, 36b may extend through the board apertures 38 to support the PCB 20 and/or ground the PCB 20 without forming a mechanical connection with the PCB 20.

The housing structure 12 defines a structure aperture 40 through which the lead-in feature 34 extends. For example, the housing structure 12 may define one structure aperture 40 for each lead-in feature 34. Each lead-in feature 34 may be press fit into a corresponding structure aperture 40.

Each pin 36a, 36b may define a pin aperture 42 therethrough, such as for increasing the elasticity of the pin 36a, 36b and/or for increasing the ease of manufacturability thereof. Similarly, each lead-in feature 34 may define a lead aperture 44 therethrough, such as for increasing the elasticity of the lead-in feature 34 and/or for increasing the ease of manufacturability thereof. The pins 36a, 36b and/or the lead-in features 34 may include retaining features to retain the fastener 32 to the PCB 20 and/or the housing structure 12. For example, the lead-in feature 34 may comprise a plurality of retaining features 46, such as one-way teeth, configured to hold the fastener 32 to the housing structure 12.

In the illustrated example, the lead-in feature 34 of each fastener 32 extends from a first side 48 of the fastener 32, and each pin 36a, 36b extends from a second side 50 of the fastener 32, where the first side 48 is opposite the second side 50. The fastener 32 may include an intermediate standoff portion 52. When the housing enclosure 10 is assembled, the intermediate standoff portion 52 is disposed between the printed circuit board 20 and the housing structure 12 to create a gap G between the printed circuit board 20 and the housing structure 12. The gap G, and thus the height H of the intermediate standoff portion 52, allows the thickness T of the thermal interface material 30 to be controlled by the height of the intermediate portion H and the gap G. The gap G and the height H are equal to each other.

In the illustrated example, the fastener 32 has a flat configuration. In other words, both intermediate standoff portion 52 and the lead-in feature 34 are flat. Even the pins 36a, 36b are flat, but the in the alternative, the pins 36a, 36b could be round. The intermediate standoff portion 52 and the lead-in feature 34 may each have a thickness U in the range of about 0.5 to 2 millimeters, such as about 1 millimeter.

Referring to FIGS. 1B, 1C, 2A-2C, and 3, the fastener 32 may include a push feature 54 configured to allow the lead-in feature 34 to be pushed into the structure aperture 40. Like the pins 36a, 36b, the push feature 54 extends from the second side 50 of the fastener 32, in this example, and the printed circuit board 20 defines a push feature opening 56 through which the push feature 54 extends. The push feature 54 may be disposed between a first pin 36a and a second pin 36b of the plurality of pins 36a, 36b. A push finger tool 58 may then be used to press on the push feature 52 in order to press the lead-in feature 34 into the structure aperture 40 to connect the fastener 32 and PCB 20 to the housing structure 12.

The fastener 32 may be formed of metal to provide EMI grounding between the printed circuit board 20 and the housing structure 12.

A sealant material may be disposed between the housing structure 12 and the cover 28. The sealant material may be disposed in a groove (not shown) formed between the housing structure 12 and the cover 28, by way of example. The sealant material may be Silicone, by way of example.

Figure 4A:
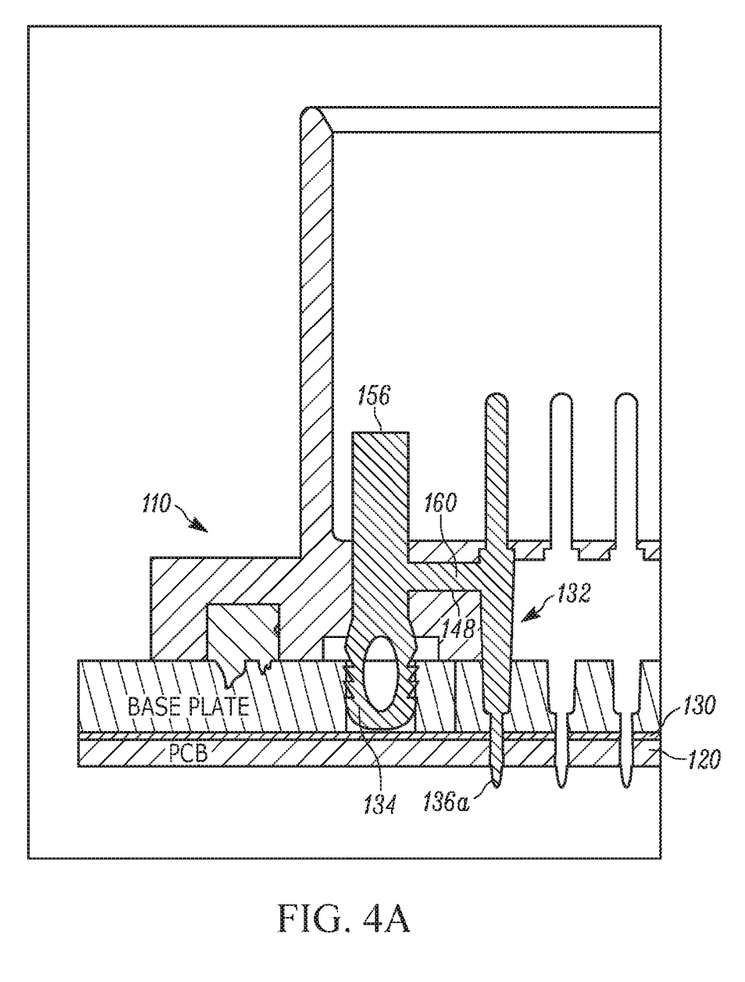
FIG. 4A is a cross-sectional view of another variation of a portion of an electronics housing and another fastener, in accordance with the principles of the present disclosure.

Referring now to FIG. 4A, another variation of an electronics housing enclosure is illustrated and generally designated at 110. The electronics housing enclosure 110 may be similar to the electronics housing enclosure 10 described above, and such description is incorporated by reference to be applied to the electronics housing enclosure 110, except where differences are specifically described.

The main difference between the electronics housing enclosure 110 and the electronics housing enclosure 10 described is that the fastener 132 has a different configuration. In the version of the fastener 132 shown in FIG. 4A, the pin 136a (or pins) extend from the same side 148 of the fastener 132 as the lead-in feature 134 extends from. An intermediate portion 160 connects the pin 136a and the lead-in feature 134, but the intermediate portion 160 is not a "standoff" because it does not create a gap between the PCB 120 and the housing structure 112. Thus, the fastener 132 connects the housing structure 112 (which is a base plate in this configuration) to the PCB 120, with the TIM 130 sandwiched therebetween. A push feature 156 allows a tool to press the lead-in feature 134 into the housing structure 112, and may possibly allow the pin 136a to be pressed into the PCB 120.

Figure 4B:
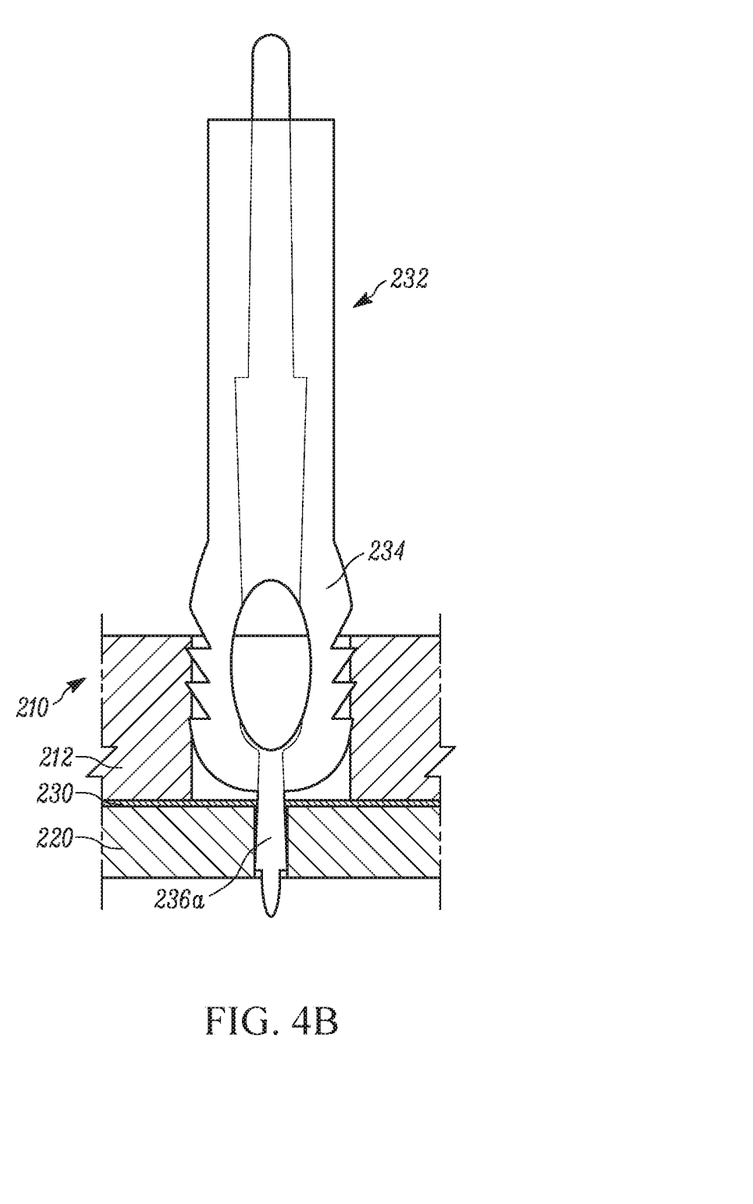
FIG. 4B is a cross-sectional view of yet another variation of a portion of an electronics housing and yet another fastener, in accordance with the principles of the present disclosure.

Referring now to FIG. 4B, yet another variation of an electronics housing enclosure is illustrated and generally designated at 210. The electronics housing enclosure 210 may be similar to the electronics housing enclosure 10 described above, and such description is incorporated by reference to be applied to the electronics housing enclosure 210, except where differences are specifically described.

In the example shown in FIG. 4B, the fastener 232 has the pin 236a extending from the lead-in feature 234. Thus, the fastener 232 connects the housing structure 212 (which is a base plate in this configuration) to the PCB 220, with the TIM 230 sandwiched therebetween.

Figure 4C:
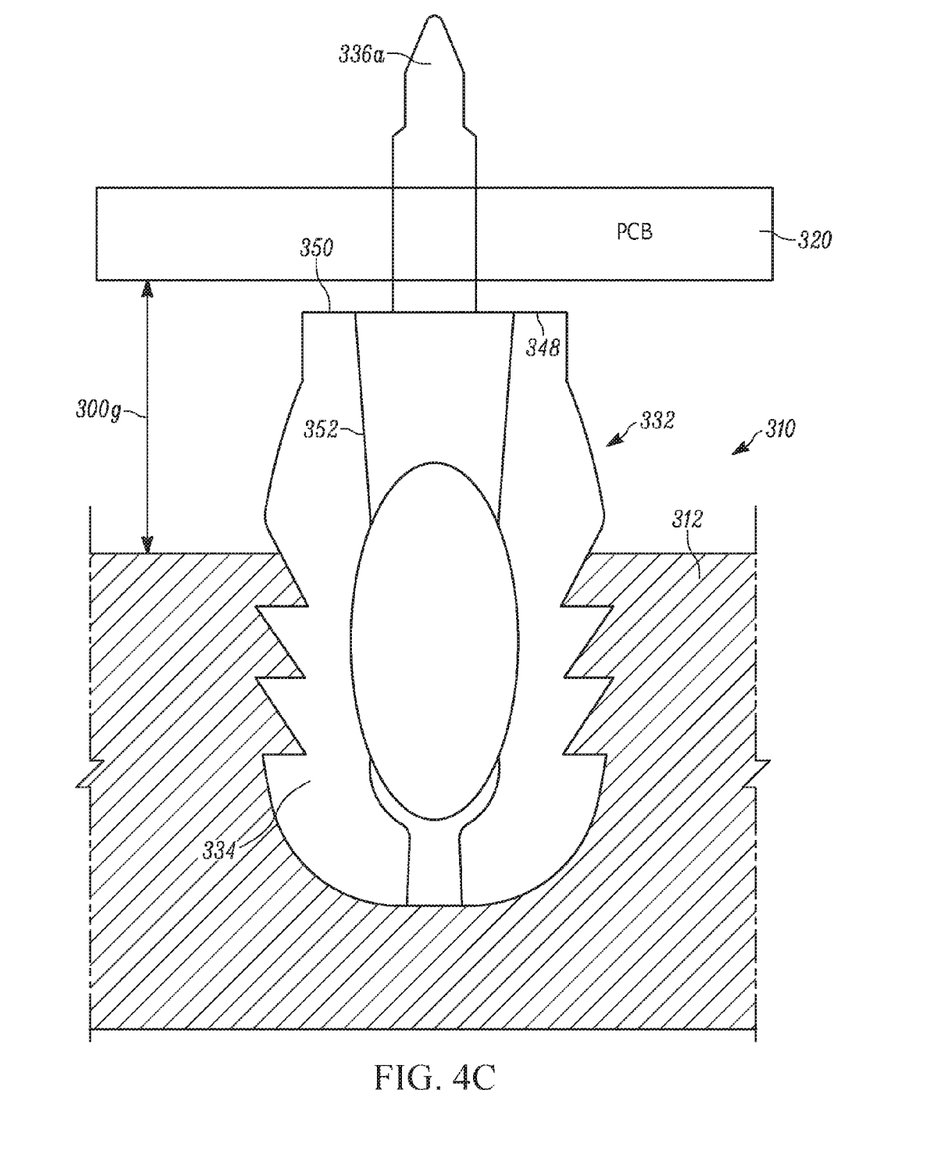
FIG. 4C is a side view of still another fastener assembled with a PCB, according to the principles of the present disclosure.

Referring now to FIG. 4C, still another variation of an electronics housing enclosure is illustrated and generally designated at 310. The electronics housing enclosure 310 may be similar to the electronics housing enclosure 10 described above, and such description is incorporated by reference to be applied to the electronics housing enclosure 310, except where differences are specifically described.

In the example shown in FIG. 4C, the fastener 332 has the lead-in feature 334 extending from a first side 348 of the fastener 332, and the pin 336a extends from a second side 350 of the fastener 332. Thus, the fastener 332 connects the housing structure 312 to the PCB 320. A gap 300g may be created between the PCB 320 and the housing structure 312 by an intermediate portion 334 of the fastener 332, but no push feature is included in this example.

Figure 5:
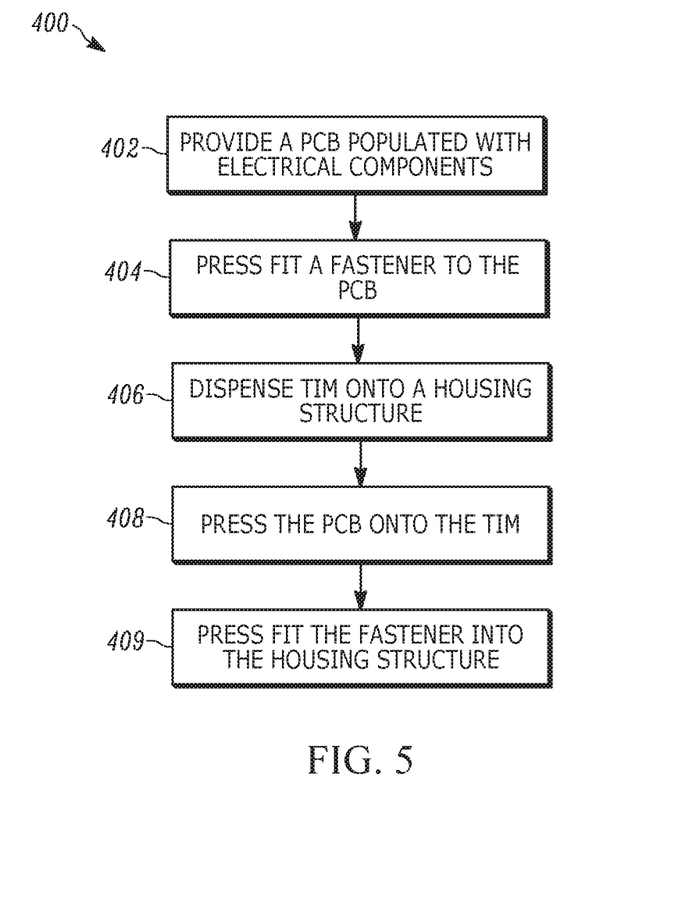
FIG. 5 is a block diagram illustrating a method of forming an engine control unit, in accordance with the principles of the present disclosure.

Referring now to FIG. 5, a method of forming an engine control unit is illustrated and generally designated at 400. The method 400 may included a step 402 of providing a printed circuit board populated with electrical components, such as one of the printed circuit boards 20, 120, 220, 320 described above.

The method 400 may also include a step 404 of press fitting a fastener to the printed circuit board. For example, the fastener 32 described above may be press fit to the PCB 20 with the pins 36a, 36b. The method 400 may further include a step 406 of dispensing thermal interface material, such as TIM 30, onto a housing structure, such as housing structure 12. The method 400 includes a step 408 of pressing the printed circuit board onto the thermal interface material.

Furthermore, the method 400 includes a step 409 of press fitting the fastener into the housing structure. For example, this step 409 may be accomplished by press fitting the lead-in feature 34 into the structure aperture 40 of the housing structure 12 by pressing on the push feature 56, which extends from the fastener 36, with the push finger tool 58.

In some variations, the method 400 may include additional steps, such as dispensing sealant material onto the perimeter of the housing structure and attaching a cover onto the housing structure, such as by crimping. The sealant material may be configured to seal an internal cavity created by the housing structure 12 and cover 28 when the electronics housing enclosure 10 is assembled with the connector 26 and printed circuit board 20.

The enclosure and method described herein may simplify the manufacturing process. By press fitting the components together, an extra step of screwing in screws is eliminated. Furthermore, greater control for the TIM thickness is provided for by allowing for the defined thickness t created by the gap g.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. An electronics housing comprising:
   an electronics housing structure defining a structure aperture therein;
   a printed circuit board disposed adjacent to the electronics housing structure, the printed circuit board defining a board aperture therethrough;
   a fastener having a lead-in feature extending from the fastener and at least one pin extending from the fastener, the lead-in feature being press fit into the structure aperture and the pin being press fit into the board aperture,
   the lead-in feature extending from a first side of the fastener, and the at least one pin extending from a second side of the fastener, the first side being opposite the second side;
   the fastener further comprising an intermediate standoff portion, wherein the intermediate standoff portion is disposed between the printed circuit board and the housing structure to create a gap between the printed circuit board and the housing structure,
   the fastener further comprising a push feature configured to allow the lead-in feature to be pushed into the structure aperture,
   the push feature extending from the second side of the fastener,
   the printed circuit board defining a push feature opening through which the push feature extends, and
   the at least one pin is a plurality of pins, the push feature being disposed between a first pin and a second pin of the plurality of pins.

2. The electronics housing enclosure of claim 1, the lead-in feature comprising a plurality of retaining features configured to hold the fastener to the housing structure.

3. The electronics housing enclosure of claim 2, the intermediate standoff portion and the lead-in feature of the fastener being flat.

4. The electronics housing enclosure of claim 3, the intermediate standoff portion and the lead-in portion each having a thickness in the range of about 0.5 to 2 millimeters.

5. The electronics housing enclosure of claim 4, further comprising thermal interface material disposed between the printed circuit board and the housing structure.

6. The electronics housing enclosure of claim 5, wherein the fastener is formed of metal to providing grounding between the printed circuit board and the housing structure.

7. A fastener for a printed circuit and electronics housing, the fastener comprising:
   an intermediate standoff portion;
   a lead-in feature extending from the intermediate standoff portion for attaching the fastener to a housing structure; and
   at least one pin extending from the intermediate standoff portion for contacting a printed circuit board, the intermediate standoff portion being disposed between the at least one pin and the lead-in feature,
   the lead-in feature extending from a first side of the fastener, and the pin extending from a second side of the fastener, the first side being opposite the second side, and
   the at least one pin being a plurality of pins, the fastener further comprising a push feature extending from the second side of the fastener, the push feature being disposed between a first pin and a second pin of the plurality of pins.

8. The fastener of claim 7, the lead-in feature comprising a plurality of retaining features configured to hold the fastener to a housing structure.

9. The fastener of claim 8, the intermediate standoff portion and the lead-in feature of the fastener being flat and each having a thickness in the range of about 0.5 to 2 millimeters, the fastener being formed of metal.

10. An electronics housing comprising:
    an electronics housing structure defining a structure aperture therein;
    a printed circuit board disposed adjacent to the electronics housing structure, the printed circuit board defining a board aperture therethrough; and
    a fastener having a lead-in feature extending from the fastener and at least one pin extending from the fastener, the lead-in feature being press fit into the structure aperture and the pin being press fit into the board aperture, the fastener further having a push feature configured to allow the lead-in feature to be pushed into the structure aperture, the lead-in feature extending from a first side of the fastener and the push feature extending from a second side of the fastener, the second side being opposite the first side, and the at least one pin extending from one of the first side in parallel relation to the lead-in feature and the second side in parallel relation with the push feature.

11. The electronics housing of claim 10, wherein the at least one pin extends from the second side of the fastener in parallel relation to the push feature.

12. The electronics housing of claim 10, wherein the at least one pin extends from the first side of the fastener in parallel relation to the lead-in feature.

13. The electronics housing of claim 12, wherein the electronics housing structure comprises a base plate having an aperture in which the lead-in feature is disposed, and the base plate is disposed between the printed circuit board and the push feature of the fastener.

14. The electronics housing of claim 10, wherein the at least one pin comprises a plurality of pins, and the push feature is disposed between a first pin and a second pin of the plurality of pins.

* * * * *